United States Patent
Weng et al.

(10) Patent No.: US 10,691,023 B2
(45) Date of Patent: Jun. 23, 2020

(54) METHOD FOR PERFORMING LITHOGRAPHY PROCESS WITH POST TREATMENT

(71) Applicant: Taiwan Semiconductor Manufacturing Co., Ltd., Hsinchu (TW)

(72) Inventors: Ming-Hui Weng, New Taipei (TW); Ching-Yu Chang, Yilang County (TW); Chin-Hsiang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 170 days.

(21) Appl. No.: 15/940,107

(22) Filed: Mar. 29, 2018

(65) Prior Publication Data

US 2019/0064673 A1    Feb. 28, 2019

Related U.S. Application Data

(60) Provisional application No. 62/549,607, filed on Aug. 24, 2017.

(51) Int. Cl.
| | |
|---|---|
| *G03F 7/40* | (2006.01) |
| *H01L 21/027* | (2006.01) |
| *G03F 7/30* | (2006.01) |
| *G03F 7/20* | (2006.01) |

(52) U.S. Cl.
CPC ............ *G03F 7/40* (2013.01); *H01L 21/0273* (2013.01); *H01L 21/0274* (2013.01); *G03F 7/20* (2013.01); *G03F 7/30* (2013.01)

(58) Field of Classification Search
CPC ....................................................... G03F 7/0035
See application file for complete search history.

(56) References Cited

U.S. PATENT DOCUMENTS

| | | | |
|---|---|---|---|
| 8,796,666 | B1 | 8/2014 | Huang et al. |
| 9,012,132 | B2 | 4/2015 | Chang |
| 9,028,915 | B2 | 5/2015 | Chang et al. |
| 9,093,530 | B2 | 7/2015 | Huang et al. |
| 9,146,469 | B2 | 9/2015 | Liu et al. |
| 9,213,234 | B2 | 12/2015 | Chang |
| 9,223,220 | B2 | 12/2015 | Chang |
| 9,256,133 | B2 | 2/2016 | Chang |
| 9,536,759 | B2 | 1/2017 | Yang et al. |

(Continued)

*Primary Examiner* — Kathleen Duda
(74) *Attorney, Agent, or Firm* — Birch, Stewart, Kolasch & Birch, LLP

(57) ABSTRACT

Methods for performing a lithography process are provided. The method for performing a lithography process includes forming a resist layer over a substrate and exposing a portion of the resist layer to form an exposed portion between unexposed portions. The method for performing a lithography process further includes developing the resist layer to remove the exposed portion of the resist layer such that an opening is formed between the unexposed portions and forming a post treatment coating material in the opening and over the unexposed portions of the resist layer. The method for performing a lithography process further includes reacting a portion of the unexposed portions of the resist layer with the post treatment coating material by performing a post treatment process and removing the post treatment coating material.

20 Claims, 11 Drawing Sheets

(56) References Cited

U.S. PATENT DOCUMENTS

| | | |
|---|---|---|
| 9,548,303 B2 | 1/2017 | Lee et al. |
| 2011/0229829 A1 | 9/2011 | Chang |
| 2012/0034558 A1 | 2/2012 | Chang |
| 2013/0323641 A1 | 12/2013 | Chang |
| 2014/0342290 A1* | 11/2014 | Wu ................ G03F 7/0035 430/285.1 |
| 2014/0363773 A1* | 12/2014 | Nakamura ........ G03F 7/0035 430/325 |

* cited by examiner

METHOD FOR PERFORMING LITHOGRAPHY PROCESS WITH POST TREATMENT

PRIORITY CLAIM AND CROSS-REFERENCE

This Application claims the benefit of U.S. Provisional Application No. 62/549,607, filed on Aug. 24, 2017, and entitled "Lithography process with post treatment and materials used thereof", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in a semiconductor structure is the higher level of integration of circuits. This is accomplished by miniaturizing or shrinking device sizes on a given chip. However, as the device sizes shrink, lithography processes used to form the devices also become more and more challenging.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
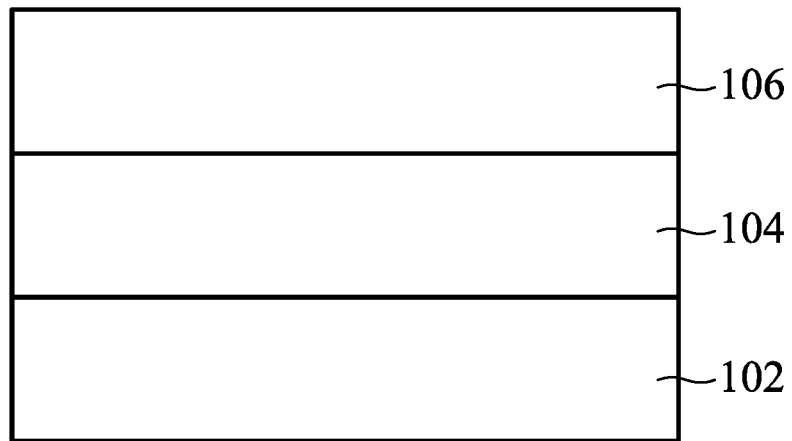
FIGS. 1A to 1H show cross-sectional representations of various stages of forming a semiconductor structure including performing a lithography process in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of methods for performing a lithography process are provided. The lithography process may include forming a resist layer over a substrate and performing an exposure process and a first developing process to the resist layer. Next, a post treatment coating material is formed over the resist layer and a post treatment process is performed. Afterwards, the post treatment coating material is removed. By forming the post treatment coating material and performing the post treatment process, the resolution of the resulting pattern in the resist layer may be improved, and the energy required to be consumed for the lithography process may be reduced.

FIGS. 1A to 1H show cross-sectional representations of various stages of forming a semiconductor structure 100 including performing a lithography process in accordance with some embodiments. As shown in FIG. 1A, a substrate 102 is received in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In some embodiments, the substrate 102 includes structures such as doped regions including wells and source/drain regions, isolation features including shallow trench isolation (STI), inter-level dielectric (ILD) layers, and/or conductive features including gate electrodes, metal lines, vias, and contacts.

A material layer 104 is formed over the substrate 102, as shown in FIG. 1A in accordance with some embodiments. The material layer 104 is configured to be patterned in subsequent manufacturing processes. The material layer 104 may be one or more material layers. In some embodiments, the material layer 104 is a dielectric layer. In some embodiments, the material layer 104 is made of metal oxides, metal nitrides, metal silicates, transition metal-oxides, transition metal-nitrides, transition metal-silicates, or oxynitrides of metals. Examples of materials used to form the material layer 104 include, but are not limited to, titanium oxide, titanium nitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials. In some embodiments, the material layer 104 is made of low-k dielectric materials. In some embodiments, the material layer 104 is made of silicon oxide, silicon nitride, silicon oxynitride, phosphosilicate glass (PSG), borophosphosilicate glass (BPSG), and/or other applicable low-k dielectric materials. In some embodiments, the material layer 104 is formed by performing a chemical vapor deposition (CVD) process, a physical vapor deposition (PVD) process, an atomic layer deposition (ALD) process, a spin-on coating process, or other applicable processes.

After the material layer 104 is formed, a resist layer 106 is formed over the material layer 104, as shown in FIG. 1A in accordance with some embodiments. In some embodiments, the resist layer 106 is formed by coating a resist material over the material layer 104. In some embodiments, the resist material used to form the resist layer 106 includes photosensitive polymers, photo-acid generators (PAG), quenchers, and a solvent. The photosensitive polymers may release electrons as being exposed to a radiation, and the electrons may induce the PAG to release acids to form an acidic environment. Next, acid labile functional groups at the photosensitive polymers may then be released in the acidic environment, and the acid labile functional group of the photosensitive polymer may be transformed into acid groups (e.g. deprotected). Accordingly, the photosensitive polymers may be insoluble in a developer used in a developing process before performing an exposure process but become soluble in the developer after performing an exposure process.

Figure 1B:
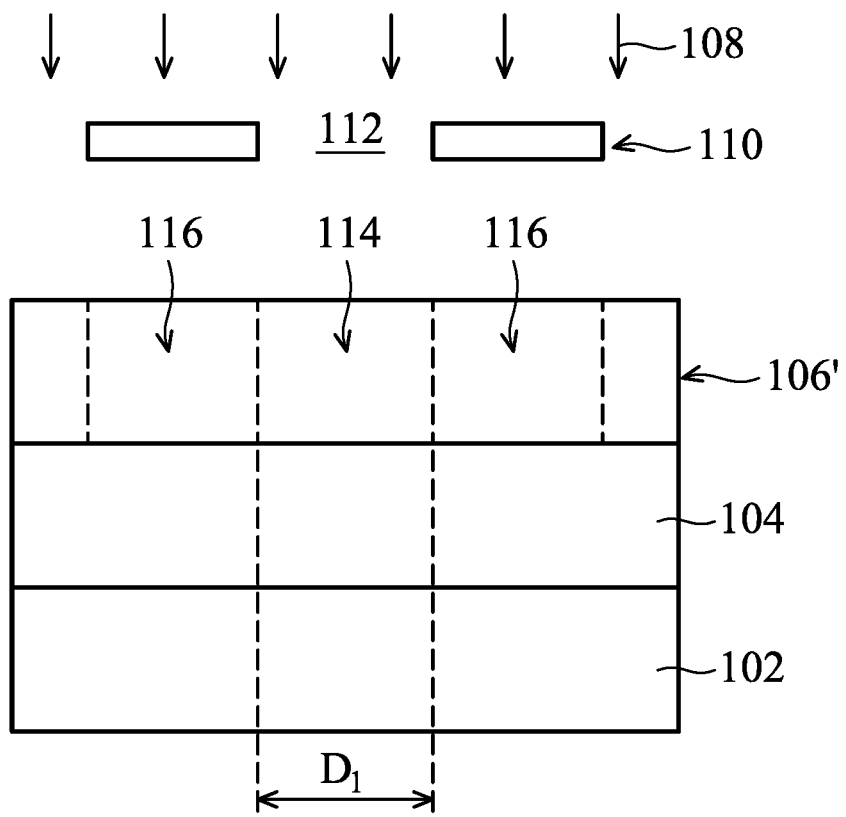

After the resist layer 106 is formed, an exposure process 108 is performed on the resist layer 106 to form a patterned resist layer 106', as shown in FIG. 1B in accordance with some embodiments. More specifically, a mask structure 110 having an opening 112 is positioned over the resist layer 106 during the exposure process 108 to form an exposed portion 114 and unexposed portions 116. In some embodiments, the exposed portion 114 is located between the unexposed portions 116.

In some embodiments, the exposure process 108 includes exposing the exposed portion 114 to a radiation. In one embodiment, the radiation has a wavelength smaller than 250 nm. In some embodiments, the radiation includes KrF, ArF, EUV, or E-beam. More specifically, the photosensitive polymers in the exposed portion 114 of the patterned resist layer 106' will release electrons as being exposed to the radiation during the exposure process, and the electrons will induce the PAG to release acids, resulting in an acidic environment. Accordingly, acid labile functional groups at the photosensitive polymers will be released in the acidic environment, and therefore the photosensitive polymers will become soluble in the developer used afterwards. After the exposure process 108 is performed, the mask structure 110 is removed.

In some embodiments, the patterned resist layer 106' is baked (e.g. heated) after the exposure process 108 is performed. In some embodiments, the amount of acid groups (e.g. —COOH group) in the exposed portion 114 of the patterned resist layer 106' increases after the patterned resist layer 106' is baked, so that the exposed portion 114 become more soluble than before it is baked.

Figure 1C:
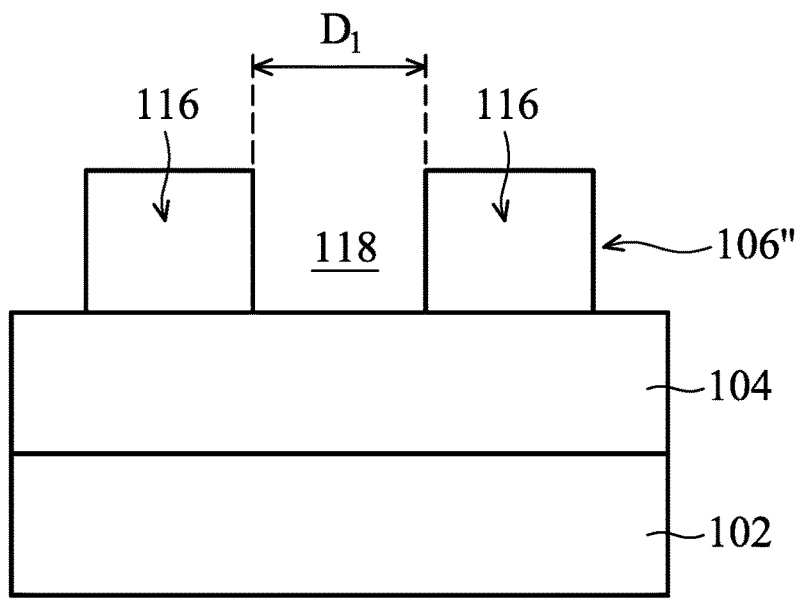

Next, a first developing process is performed on the patterned resist layer 106' to remove the exposed portions 114, such that an opening 118 is formed between the unexposed portions 116, as shown in FIG. 1C in accordance with some embodiments. More specifically, the exposed portions 116 of the patterned resist layer 106'' are dissolved in a first developer used in the first developing process and are removed with the first developer. As described previously, the acid groups of the exposed portion 114 of the patterned resist layer 106' are de-protected in the acidic environment and therefore the exposed portion 114 become soluble in the first developer used in the first developing process. On the other hand, the unexposed portions 116 are not exposed to a radiation during the exposure process 108, and the unexposed portions 116 of the patterned resist layer 106' remains insoluble in the first developer during the first developing process. In some embodiments, the first developer includes tetramethylammonium hydroxide (TMAH).

Figure 1D:
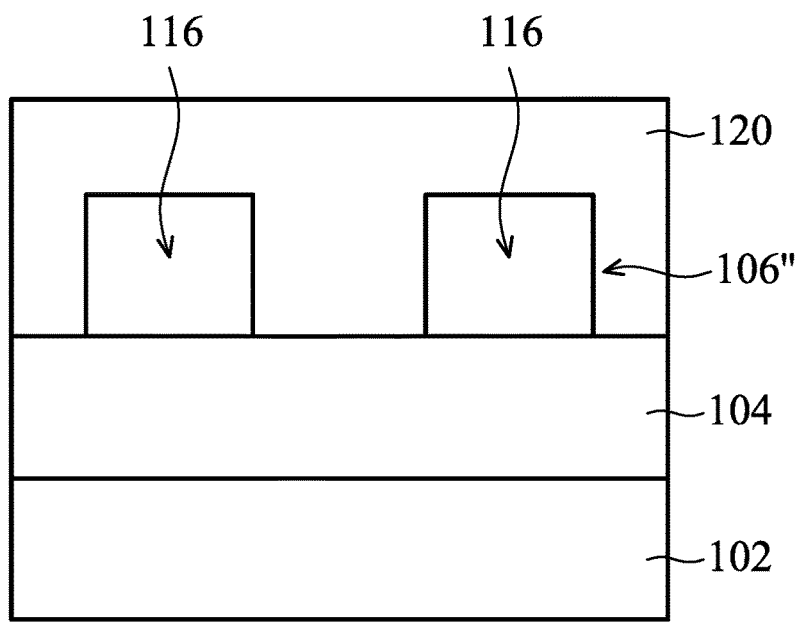

After the first developing process is performed, a post treatment coating material 120 is formed in the opening 118 and over the unexposed portions 116, as shown in FIG. 1D in accordance with some embodiments. In addition, the opening 118 is fully filled with the post treatment coating material 120 in accordance with some embodiments. The post treatment coating material 120 may be a precursor for releasing acids, so that the acids produced by the post treatment coating material 120 may react with the peripheral portion of the unexposed portions 116. In some embodiments, the post treatment coating material 120 includes photo-acid generator (PAG) and thermal acid generator (TAG). Details of the post treatment coating material 120 will be described afterwards.

Figure 1E:
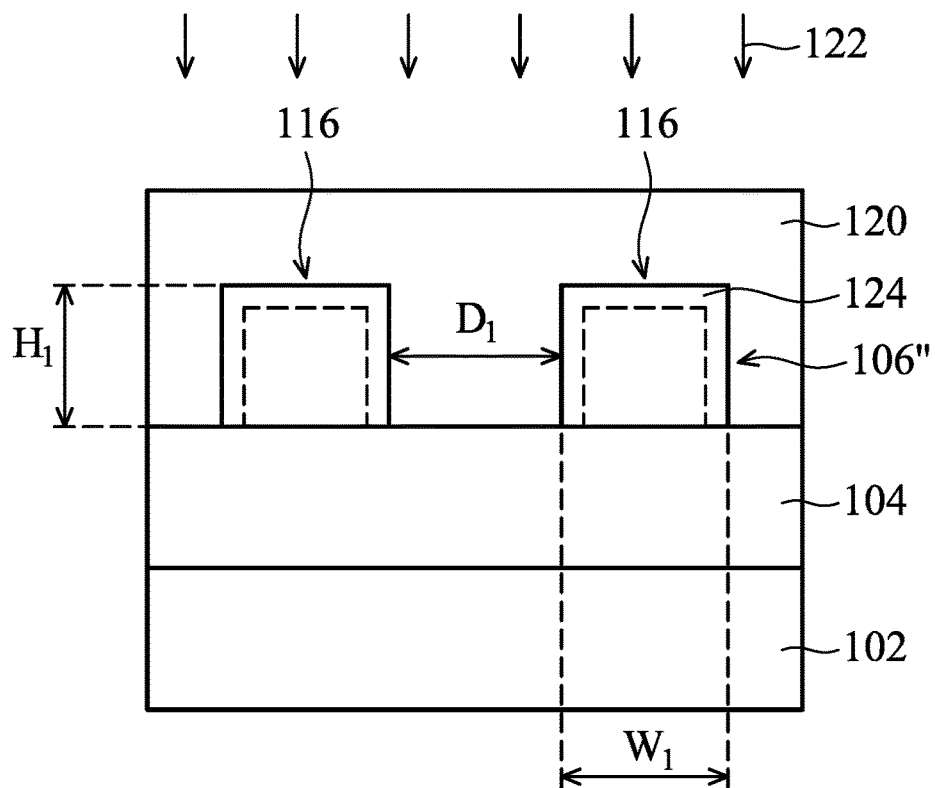

After the post treatment coating material 120 is formed, a post treatment process 122 is performed onto the post treatment coating material 120, as shown in FIG. 1E in accordance with some embodiments. The post treatment process 122 is configured to induce the formation of acids in the post treatment coating material 120, so that the acids may react with the peripheral portion 124 of the unexposed portions 116. In some embodiments, the acids released during the post treatment process 122 has a pKa value less than about 3. In addition, the post treatment process 122 may be configured to control the diffusion distance of the post treatment coating material 120, so that the size of the resulting unexposed portions may be formed as designed (Details will be described later.)

In some embodiments, the post treatment process 122 is a thermal baking process. As described above, the post treatment coating material 120 may include thermal acid generators which tend to release acids when the post treatment coating material 120 is heated. Accordingly, the post treatment process 122 may be a thermal baking process, so that the thermal acid generators may be decomposed during the post treatment process 122 to release acids in the post treatment coating material 120.

In some embodiments, the post treatment process 122 includes heating the post treatment coating material 120 under a temperature in a range of about 60° C. to about 200° C. In some embodiments, the post treatment coating material 120 is heated for about 5 sec to about 300 sec. The temperature and the time for performing the post treatment process 122 is controlled to be high/long enough to trigger the reaction between the post treatment coating material 120 and the unexposed portion 116. On the other hand, the temperature and the time for performing the post treatment process 122 should not be too high/long, or intermixing/diffusion between the post treatment coating material 120 and the unexposed portions may become too much.

In some embodiments, the post treatment process 122 is a radiation curing process. In some embodiments, the radiation curing process includes exposing the post treatment coating material 120 to a radiation. In some embodiment, the radiation has a wavelength smaller than 365 nm. In some embodiments, the radiation includes i-line, KrF, ArF, EUV, or E-beam.

As described above, the post treatment coating material 120 may include photo-acid generators which tend to release acids when the post treatment coating material 120 reacts with radiation. Accordingly, the post treatment process 122 may be a radiation curing process, so that the photo-acid generators may be decomposed during the post treatment process 122 to release acids in the post treatment coating material 120.

In some embodiments, the post treatment coating material 120 may diffuse from the top surface and the sidewalls of the unexposed portions 116 toward the center of the unexposed portions 116, and the post treatment coating material 120 will release acids, so that the acids will react with the unexposed portions 116 of the patterned resist layer 106 during the post treatment process 122. For example, the acids may react with the peripheral portion 124 of the unexposed portion 116 of the patterned resist layer 106".

In some embodiments, the peripheral portion 124 of the unexposed portion 116 of the patterned resist layer 106" has a thickness in a range from about 1 nm to about 50 nm. The peripheral portion 124 of the unexposed portion 116 of the patterned resist layer 106" may be defined as the portion of the unexposed portion 116 reacting with the acids released from the post treatment coating material 120.

Figure 1F:
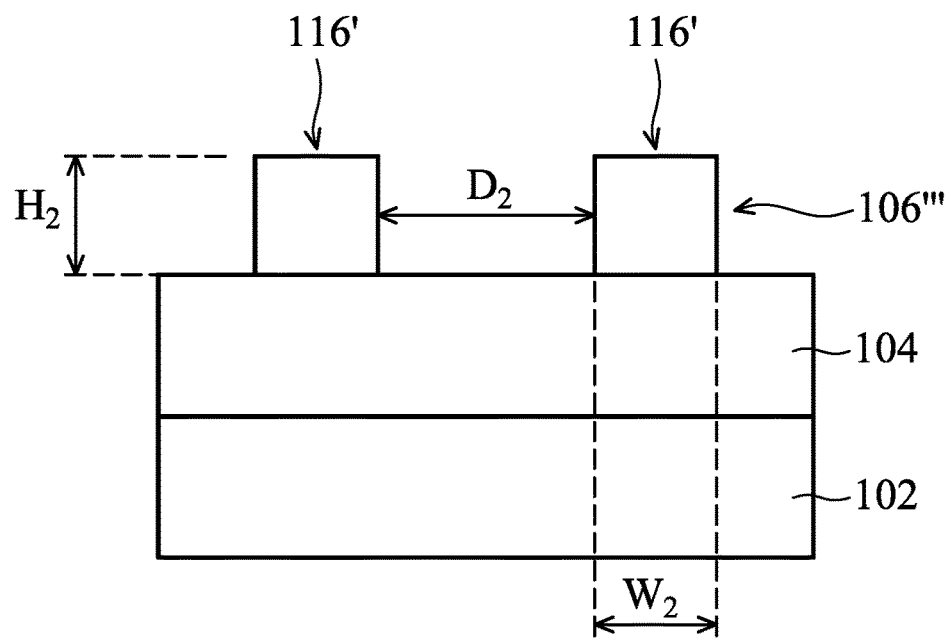

After the post treatment process 122 is performed, a second developing process is performed to remove the post treatment coating material 120, as shown in FIG. 1F in accordance with some embodiments. In addition, the peripheral portions 124 of the unexposed portions 116 are also removed by the second developing process in accordance with some embodiments.

More specifically, a second developer is used in the second developing process, and both the post treatment coating material and the peripheral portions 124 of the unexposed portions 116 are dissolved in the second developer in accordance with some embodiments. In some embodiments, the second developer used in the second developing process is the same as the first developer used in the first developing process described above. In some embodiments, the second developer includes tetramethyl-ammonium hydroxide (TMAH). In some embodiments, the second developer includes 2.38% of TMAH or less than 2.38% of TMAH solution.

Since the peripheral portions 124 of the unexposed portions 116 are removed by the second developing process, the size of the unexposed portion 116' of the patterned resist layer 106''' shown in FIG. 1F is smaller than the size of the unexposed portion 116 of the patterned resist layer 106" shown in FIG. 1E in accordance with some embodiments. That is, the distance $D_2$ between the unexposed portions 116' shown in FIG. 1F is greater than the distance $D_1$ between the unexposed portion 116 shown in FIG. 1E.

In some embodiments, the width $W_1$ of the unexposed portion 116 of the patterned resist layer 106" shown in FIG. 1E is greater than the width $W_2$ of the unexposed portion 116' of the patterned resist layer 106''' shown in FIG. 1F. In some embodiments, the difference between the width $W_1$ and the width $W_2$ is in a range from about 1 nm to about 50 nm. Since the width $W_1$ of the unexposed portion 116 can be reduced by performing the post treatment process, the energy used in the exposure process 108 may be reduced (Details will be described later.)

In some embodiments, the height $H_1$ of the unexposed portion 116 of the patterned resist layer 106" shown in FIG. 1E is greater than the height $H_2$ of the unexposed portion 116' of the patterned resist layer 106''' shown in FIG. 1F. In some embodiments, the difference between the height $H_1$ and the height $H_2$ is in a range from about 1 nm to about 50 nm. Since the height $H_2$ of the unexposed portion 116 can be reduced by performing the post treatment process, the aspect ratio of the unexposed portion 116 may also be reduced. Therefore, risks of bending or cracking of the resist layer due to the high aspect ratio (or large height) may also be reduced.

Figure 1G:
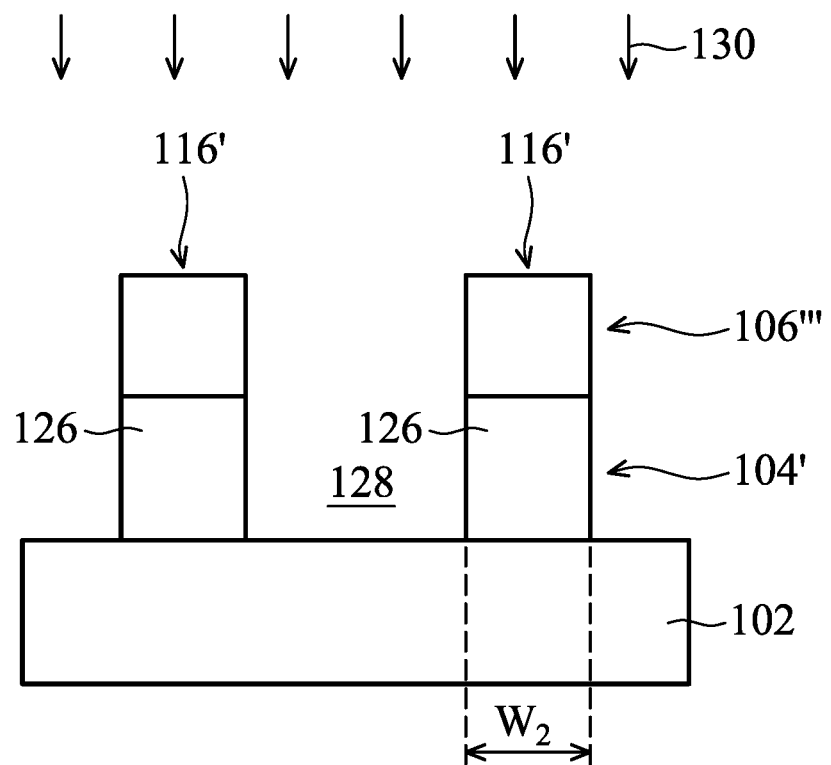

Next, an etching process 130 is performed to etch the material layer 104 using the unexposed portions 116' as masks, as shown in FIG. 1G in accordance with some embodiments. In some embodiments, the etching process 130 is a dry etching process, such as a plasma etching process. After the etching process 130 is performed, the material layer 104 is patterned to form patterns 126 of the patterned material layer 104'. In addition, an opening 128 is formed between the patterns 126 of the patterned material layer 104', as shown in FIG. 1G in accordance with some embodiments.

Figure 1H:
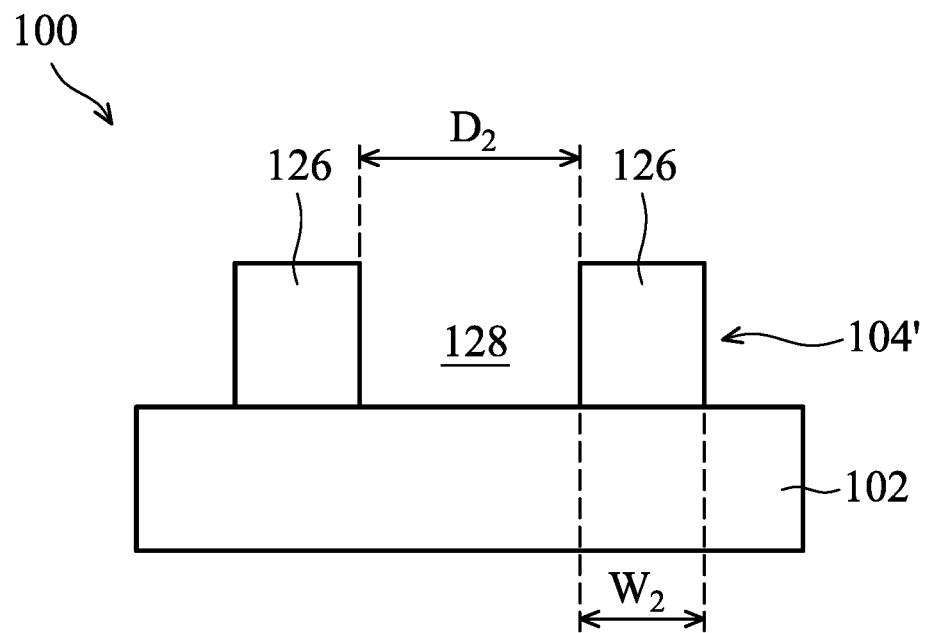

After the etching process 130 is performed, the unexposed portions 116' of the patterned resist layer 106''' are removed, as shown in FIG. 1H in accordance with some embodiments. The patterns 126 may have a width substantially equal to the width $W_2$ of the unexposed portion 116' shown in FIG. 1E. In addition, the distance between the patterns 126 in the patterned material layer 104' may be substantially equal to the distance D2 between the unexposed portions 116' shown in FIG. 1E.

As described previously, the method for manufacturing the semiconductor structure 100 includes performing a lithography process using the post treatment coating material 120 and performing the post treatment process 122 in accordance with some embodiments. More specifically, the post treatment coating material 120 is formed over the patterned resist layer 106' and the post treatment process 122 is performed afterwards. In addition, the post treatment coating material 120 is configured to be a precursor for releasing acids, so that the acids produced by the post treatment coating material 120 may react with the peripheral portions 124 of the unexposed portions 116.

In some embodiments, the post treatment coating material 120 includes a polymer, a photo-acid generator (PAG) and/or a thermal acid generator (TAG), and a solvent. The solvent may be chosen so that it will not intermix with the resist layer 106. That is, the resist layer 106 should be insoluble to the solvent of the post treatment coating material 120. In some embodiments, the solvent is alcohol, ether, ester, or the like. In some embodiments, the solvent is $H_2O$, methanol, ethanol, propanol, butanol, isopropyl alcohol (IPA), ethylene glycol, methyl isobutyl carbinol (MIBC), diisopentyl ether (DIAE), dimethyl ether, diethyl ether, dipropyl ether, dibutyl ether, normal butyl acetate (NBA), or combinations thereof.

Figure 2A:
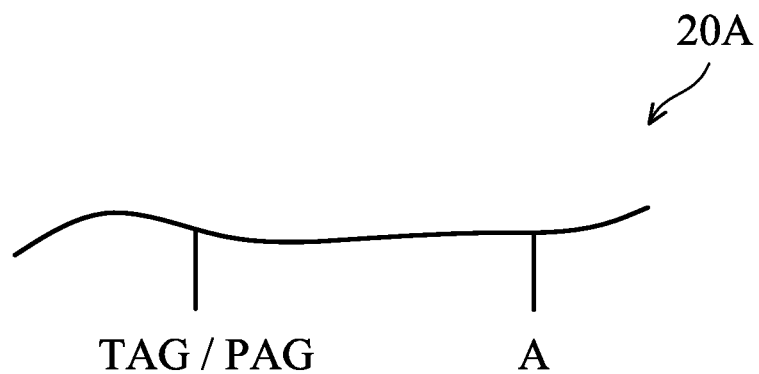
FIG. 2A illustrates a polymer in the post treatment coating material that has PAG/TAGs bonding to the polymer in accordance with some embodiments.

The polymer in the post treatment coating material 120 may include PAG and/or TAGs bonding thereto or may be blended with PAG and/or TAGs. FIG. 2A illustrates a polymer 20A in the post treatment coating material 120 that has PAG/TAGs bonding to the polymer in accordance with some embodiments.

As shown in FIG. 2A, the polymer 20A has a main chain and at least two functional groups bonding to the main chain. The first functional group A is configured to adjust the solubility of the polymer 20A and the second functional group is configured to release acids in the post treatment coating material 120.

In particular, the polymer is designed to be soluble in the solvent but the resist layer 106 should be in-soluble to the solvent. In some embodiments, the first functional group A is a moiety of a monomer A with acidity. In some embodiments, the pKa value of the monomer A is less than 4.5. In some embodiments, the first functional group A is a moiety of mathacrylic acid (MAA), methyl methacrylate (MMA), vinyl alcohol, hydroxystyrene (HS), 4-styrenesulfonic acid, fluoro-alcohol substituted alkane, or a fluorine substituted alkane. In some embodiments, the first functional group A is a fluoro-alcohol substituted alkyl group or a fluorine substituted alkyl group. In some embodiments, the first functional group A is a fluorine-substituted $C_1$-$C_{10}$ alkyl group.

In some embodiments, the second functional group is a moiety of PAG or TAG. For example, the PAG/TAG may be bonded to the main chain of the polymer 20A through a covalent bond. In some embodiments, the second functional group is a moiety of the following formula (I):

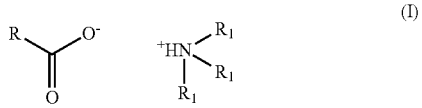

(I)

In some embodiments, R in formula (I) is $C_1$-$C_{10}$ alkyl, $C_3$-$C_{10}$ alkenyl, $C_3$-$C_{10}$ alkynyl, or $C_1$-$C_{10}$ alkoxy, and $R_1$ in formula (I) is hydrogen, $C_1$-$C_{10}$ alkyl, $C_3$-$C_{10}$ alkenyl, $C_3$-$C_{10}$ alkynyl, or $C_1$-$C_{10}$ alkoxy. In some embodiments, R in formula (I) is a fluorine-substituted alkyl group, such as a fluorine-substituted $C_1$-$C_{10}$ alkyl group. In some embodiments, the molecular weight of R in formula (I) is greater than 15. In some embodiments, the molecular weight of R in formula (I) is in a range from about 15 to about 500. The molecular weight of the R group should be great enough to limit the diffusion of the polymer. In some embodiments, a carbon in the R group of the compound shown in formula (I) is bonded to the main chain of the polymer 20A through a covalent bond.

In some embodiments, the second functional group is a moiety of the following formula (II):

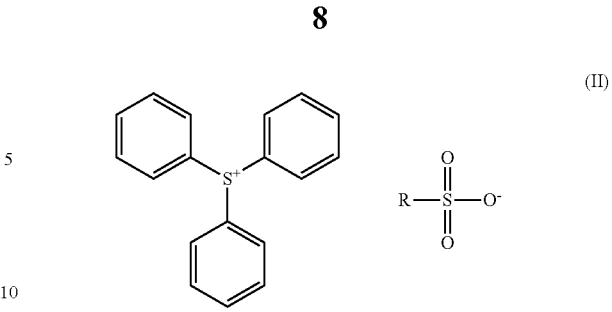

(II)

In some embodiments, R in formula (II) is $C_1$-$C_{10}$ alkyl, $C_3$-$C_{10}$ alkenyl, $C_3$-$C_{10}$ alkynyl, or $C_1$-$C_{10}$ alkoxy. In some embodiments, R in formula (II) is a fluorine-substituted alkyl group, such as a fluorine-substituted $C_1$-$C_{10}$ alkyl group. In some embodiments, the molecular weight of R in formula (II) is greater than 15. In some embodiments, the molecular weight of R in formula (II) is in a range from about 15 to about 500. The molecular weight of the R group should be great enough to limit the diffusion distance of the polymer. In some embodiments, a carbon in the R group of the compound shown in formula (II) is bonded to the main chain of the polymer 20A through a covalent bond.

In some embodiments, the second functional group is a moiety of the following formula (III):

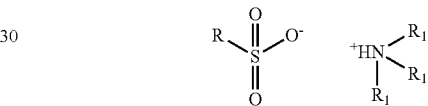

In some embodiments, R in formula (III) is $C_1$-$C_{10}$ alkyl, $C_3$-$C_{10}$ alkenyl, $C_3$-$C_{10}$ alkynyl, or $C_1$-$C_{10}$ alkoxy. In some embodiments, R in formula (III) is a fluorine-substituted alkyl group, such as a fluorine-substituted $C_1$-$C_{10}$ alkyl group. $R_1$ in formula (III) is hydrogen, $C_1$-$C_{10}$ alkyl, $C_3$-$C_{10}$ alkenyl, $C_3$-$C_{10}$ alkynyl, or $C_1$-$C_{10}$ alkoxy. In some embodiments, the molecular weight of R in formula (III) is greater than 15. In some embodiments, the molecular weight of R in formula (III) is in a range from about 15 to about 500. The molecular weight of the R group should be great enough to limit the diffusion of the polymer. In some embodiments, a carbon in the R group of the compound shown in formula (III) is bonded to the main chain of the polymer 20A through a covalent bond.

In some embodiments, the polymer 20A has a weight average molecular weight in a range from about 2000 to about 500000. As described above, the size (i.e. molecular weight) of the polymer 20A may be controlled so that the diffusion distance of post treatment coating material 120 may be easier to control.

In some embodiments, the mole ratio of the first functional group to the second functional group is in a range from about 1 to about 100. As described above, the first functional group may be seen as a solubility controller, and the second functional group may be seen as an acid generator. More specifically, the first functional group A is configured to adjust the solubility of the polymer 20A and the second functional group is configured to release acids in the post treatment coating material 120. Therefore, the ratio of the first functional group to the second functional group may be controlled so that a proper amount of the acids can be released from the polymer 20A and the polymer 20A can be soluble in the solvent in the post treatment coating material.

Figure 2B:
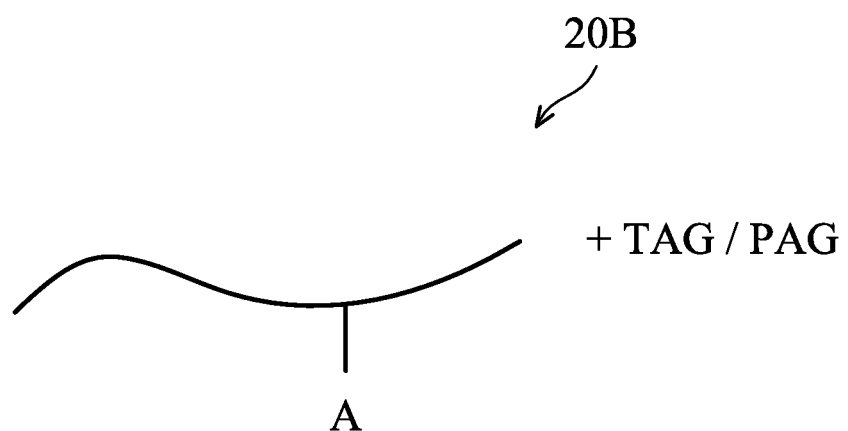
FIG. 2B illustrates a polymer and PAG/TAGs mixing in the post treatment coating material in accordance with some embodiments.

In some other embodiments, the polymer in the post treatment coating material 120 is blended with PAG and/or TAG. FIG. 2B illustrates a polymer 20B and PAG/TAGs mixing in the post treatment coating material 120 in accordance with some embodiments. As shown in FIG. 2B, the polymer 20B has a main chain and the first functional group A bonding to the main chain. The first functional group A is configured to adjust the solubility of the polymer 20A. Examples of the first functional group A shown in FIG. 2B may be similar to, or the same as, those of the first functional group A shown in FIG. 2A and described above and are not repeated herein.

As shown in FIG. 2B, PAG/TAG is not chemically bonded to the polymer 20B but is mixed with the polymer 20B in accordance with some embodiments. In some embodiments, the PAG/TAG has the following formula (I), (II), or (III):

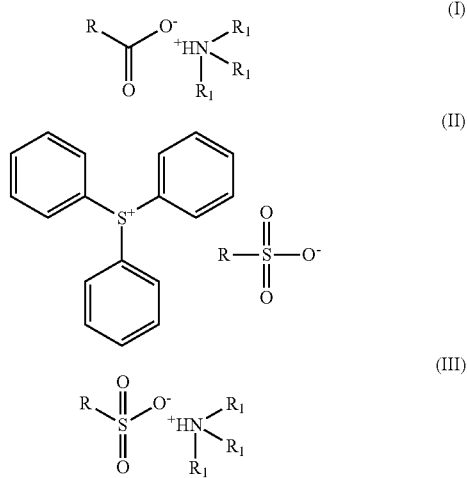

In some embodiments, R in formula (I), (II), and (III) are independently selected from $C_1$-$C_{10}$ alkyl, $C_3$-$C_{10}$ alkenyl, $C_3$-$C_{10}$ alkynyl, and $C_1$-$C_{10}$ alkoxy. In some embodiments, R in formula (II) is a fluorine-substituted alkyl group, such as a fluorine-substituted $C_1$-$C_{10}$ alkyl group. $R_1$ in formula (I) and (III) are independently selected from hydrogen, $C_1$-$C_{10}$ alkyl, $C_3$-$C_{10}$ alkenyl, $C_3$-$C_{10}$ alkynyl, and $C_1$-$C_{10}$ alkoxy. In some embodiments, the molecular weight of R in formula (I), (II), and (III) is greater than 15. In some embodiments, the molecular weight of R in formula (I), (II), and (III) is in a range from about 15 to about 500. In some embodiments, the PAG has a molecular weight in a range from about 300 to about 1000. In some embodiments, the TAG has a molecular weight in a range from about 60 to about 600. Similar to the PAG/TAG shown in FIG. 2A and described above, the PAG/TAG in the mixture of the polymer 20B and PAG/TAG is configured to release acids in the post treatment coating material 120.

In some embodiments, the amount of TAG/PAG is greater than 0.1 wt %. In some embodiments, the amount of TAG/PAG is in a range from about 1 wt % to about 30 wt %. In some embodiments, the amount of TAG/PAG is in a range from about 1 wt % to about 70 wt %.

As described above, the post treatment coating material 120 covers the top surfaces and the sidewalls of the unexposed portions 116 (e.g. FIG. 1D). After the post treatment coating material 120 is formed, the post treatment process 122 is performed (e.g. FIG. 1E) to produced acids in the post treatment coating material 120.

In some embodiments, the post treatment coating material 120 includes PAG, and therefore a radiation curing process is performed as the post treatment process 122, so that acids are formed in the post treatment coating material 120 in accordance with some embodiments. In some other embodiments, the post treatment coating material 120 includes TAG, and therefore a thermal baking process is performed as the post treatment process 122, so that acids are formed in the post treatment coating material 120.

As described previously, the resist layer 106 may be made of photosensitive polymers and the photosensitive polymers may include acid labile functional groups. Therefore, when the acids are formed in the post treatment coating material 120 during the post treatment process 122, the acids will react with the unexposed portions 116 of the patterned resist layer 106", such that the acid labile functional groups in the unexposed portions 116 of the patterned resist layer 106" will be released in the acidic environment and will be transformed into acid groups (e.g. —COOH). That is, the portions of the unexposed portions 116 of the patterned resist layer 106" reacting with the acids released by the post treatment coating material 120 may become soluble in a developer (e.g. the second developer) while the portions of the unexposed portions 116 not react with the acids remain insoluble to the developer.

In some embodiments, the post treatment coating material 120 diffuses into the peripheral portions 124 of the unexposed portions 116, so that the peripheral portions 124 of the unexposed portions 116 can react with the acids released in the post treatment material 120 and be dissolved in the second developer. Therefore, the peripheral portions 124 of the unexposed portions 116 can be removed during the second developing process.

Accordingly, the distance $D_2$ between the unexposed portions 116' shown in FIG. 1F is greater than the distance $D_1$ between the unexposed portions 116 that is formed by the exposure process 108 and the first developing process shown in FIG. 1C. Therefore, although the final opening 128 between the patterns 126 of the patterned material layer 104' has the distance $D_2$, the energy (e.g. radiation) used in the manufacturing process only need to expose the exposed portion 114 shown in FIG. 1B that has the distance $D_1$, which is shorter than $D_2$. That is, the energy required to form the patterns 126 may be reduced.

It should be noted that although the unexposed portions 116' of the patterned resist layer 106''' are used as masks in the etching process 124 for patterning the material layer 104, the unexposed portions 116' of the patterned resist layer 106''' may be used for different purposes in other embodiments. For example, the unexposed portions 116' of the patterned resist layer 106''' may be used as masks in an implantation process to implant dopants in the portions of material layer not covered by the unexposed portions 116'.

Figure 3A:
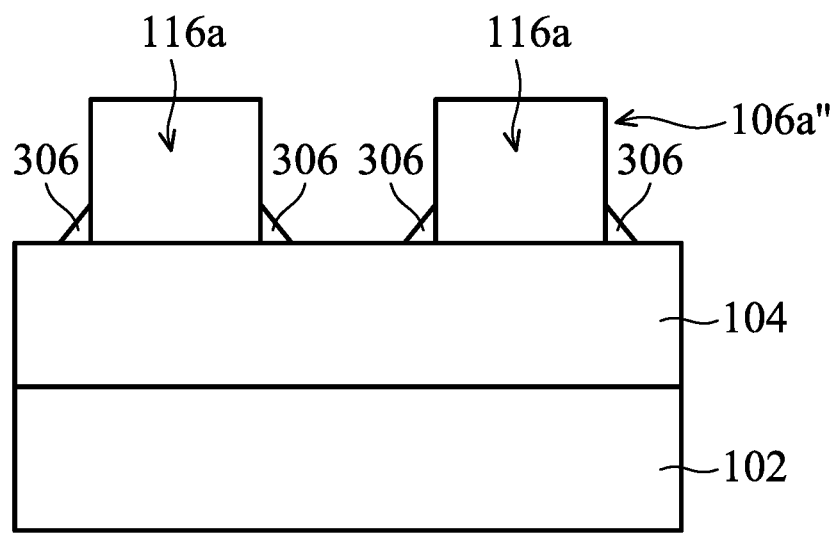
FIGS. 3A to 3C show cross-sectional representations of various stages of performing a lithography process in accordance with some embodiments.
Figure 3B:
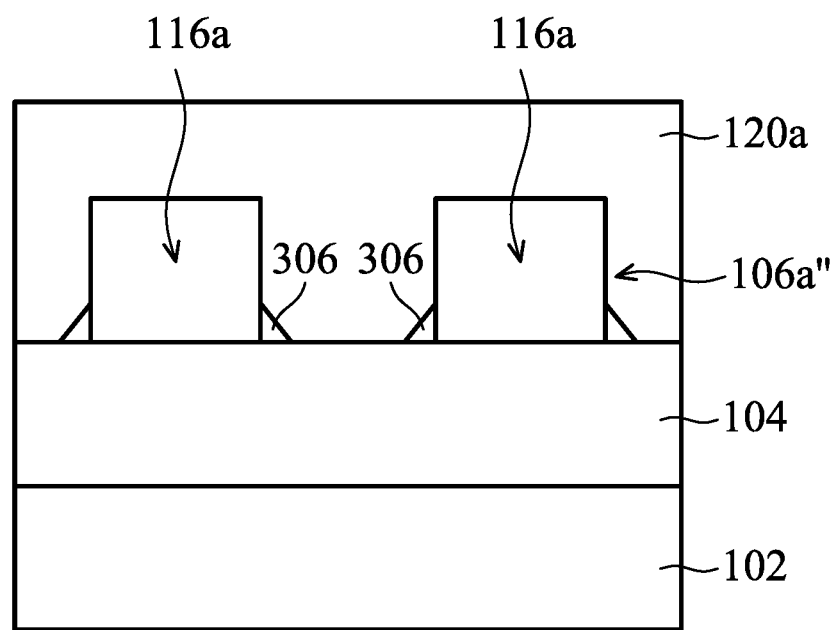
Figure 3C:
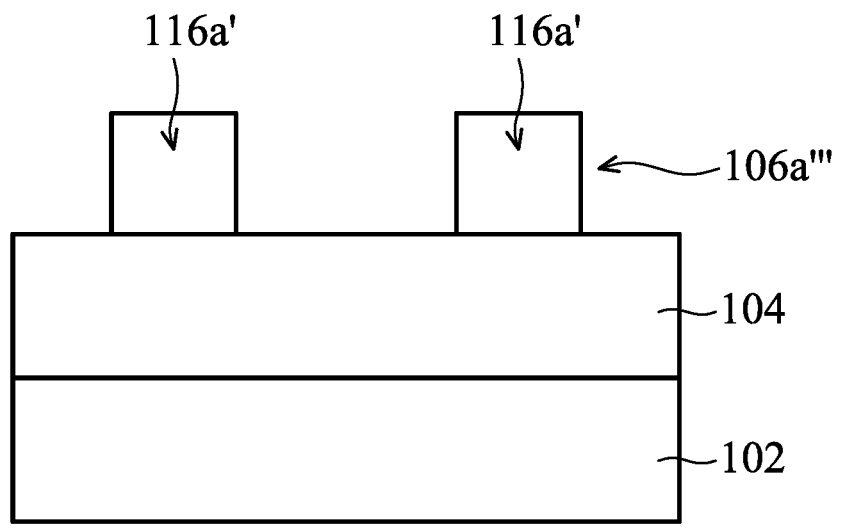

FIGS. 3A to 3C show cross-sectional representations of various stages of performing a lithography process in accordance with some embodiments. The lithography process shown in FIGS. 3A to 3C may be similar to the lithography process shown in FIGS. 1A to 1H, except some portions of the exposed portions of the resist layer remain on the material layer 104 after the first developing process is performed. Some materials and processes of the lithography process shown in FIGS. 3A to 3C may be similar to, or the same as, those shown in FIGS. 1A to 1H and are not repeated herein.

In particular, an exposure process similar to those shown in FIGS. 1A and 1B may be performed, and a first developing process may be performed to remove the exposed portions of the patterned resist layer 106a'', as shown in FIG. 3A in accordance with some embodiments. However, unlike those shown in FIG. 1C, the exposed portions of the patterned resist layer 106a'' are only partially removed by the first developing process. As shown in FIG. 3A, remaining portions 306 of the exposed portions of the patterned resist layer 106a'' remain at the bottom portion of the sidewalls of the unexposed portions 116a in accordance with some embodiments. In some embodiments, the remaining portions 306 of the exposed portions of the patterned resist layer 106a'' also cover a portion of the material layer 104 over the substrate 102.

After the first developing process is performed to at least partially remove the exposed portions, a post treatment coating material 120a is formed to cover the patterned resist layer 106a'', as shown in FIG. 3B in accordance with some embodiments. In some embodiments, the post treatment coating material 120a is directly formed on the top surface and the sidewalls of the unexposed portions 116a and on the remaining portions 306 of the exposed portions of the patterned resist layer 106a''. The materials for forming the post treatment coating material 120a may be similar to, or the same as, the materials for forming the post treatment coating material 120 described previously and are not repeated herein.

After the post treatment coating material 120a is formed, a post treatment process is performed first and a second developing process is performed afterwards to remove the post treatment coating material 120a, as shown in FIG. 3C in accordance with some embodiments. In addition, the remaining portions 306 of the exposed portions are also removed in the second developing process. The post treatment process and the second developing process may be similar to, or the same as, the post treatment process 122 and the second developing process shown in FIGS. 1A to 1H described previously.

More specifically, the post treatment coating material 120 releases acids during the post treatment process, so that the remaining portions 306 of the exposed portions of the patterned resist layer 106a'' react with the acids and become soluble in the second developer used in the second developing process in accordance with some embodiments. In addition, the periphery portion of the unexposed portions 116a may also react with the acids and become soluble in the second developer used in the second developing process. That is, both the remaining portions 306 of the exposed portions and the periphery portion of the unexposed portions 116a are dissolved in the second developer in the second developing process in accordance with some embodiments.

Accordingly, the size of the resulting unexposed portions 116a' of the patterned resist layer 106a''' shown in FIG. 3C is smaller than the size of the unexposed portion 116a shown in FIG. 3A in accordance with some embodiments. The differences of their heights and widths between the unexposed portions 116a' and the unexposed portion 116a may be similar to, or the same as, those between the unexposed portions 116' shown in FIG. 1F and the unexposed portion 116 shown in FIG. 1E described previously and are not repeated herein.

As described previously, the patterned resist layer 106a''' may be used as masks for patterning the material layer 104 therebelow. Therefore, if the remaining portions 306 of the exposed portions are not removed, the resolution of the resulting pattern of the material layer 104 may be reduced. Accordingly, by applying the post treatment coating material 120a and the post treatment process, the resolution of the lithography process may be improved.

Figure 4A:
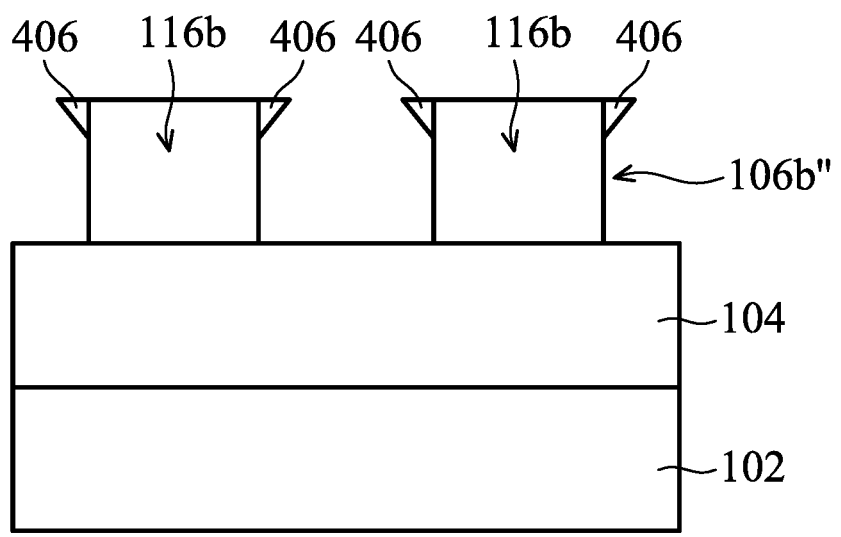
FIGS. 4A to 4C show cross-sectional representations of various stages of performing a lithography process in accordance with some embodiments.
Figure 4B:
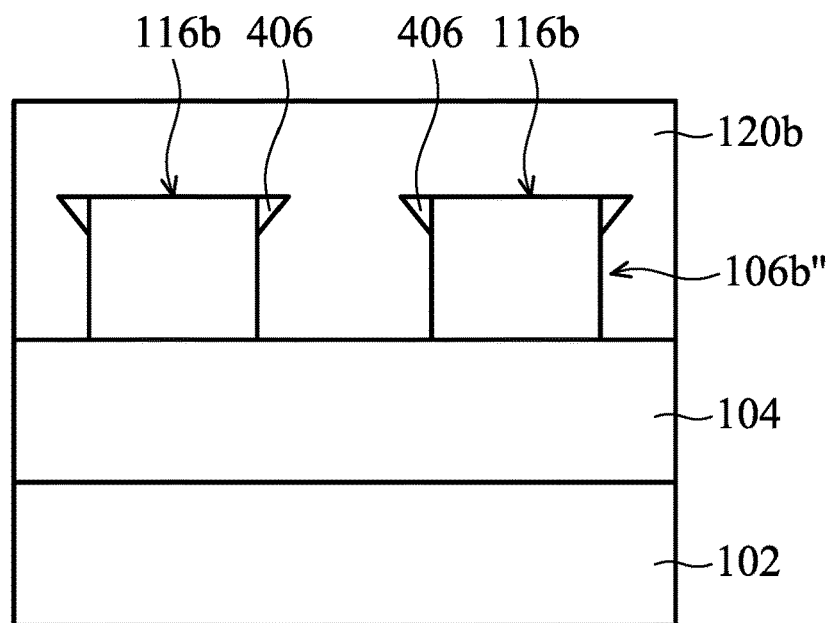
Figure 4C:
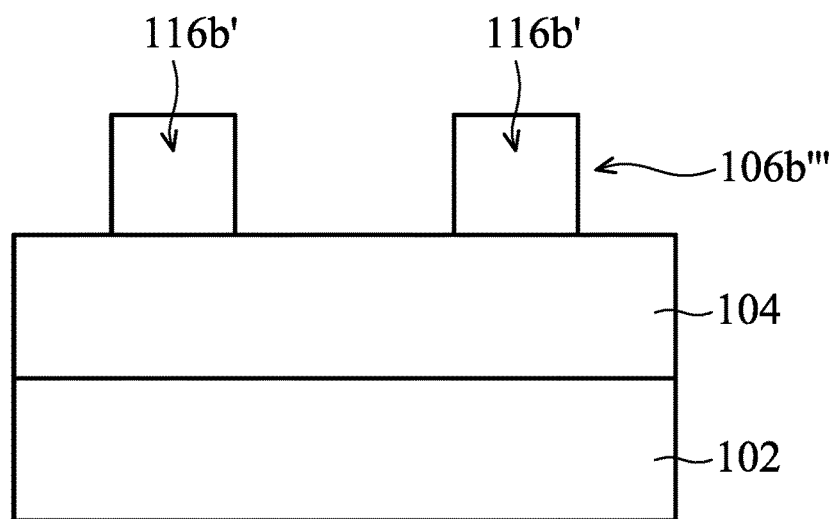

FIGS. 4A to 4C show cross-sectional representations of various stages of performing a lithography process in accordance with some embodiments. The lithography process shown in FIGS. 4A to 4C may be similar to the lithography process shown in FIGS. 3A to 3C, except the remaining portions of the exposed portions of patterned the resist layer is located at the upper portion of the unexposed portions. Some materials and processes of the lithography process shown in FIGS. 4A to 4C may be similar to, or the same as, those shown in FIGS. 1A to 1H and 3A to 3C and are not repeated herein.

In particular, an exposure process similar to those shown in FIGS. 1A and 1B may be performed, and a first developing process may be performed to partially remove the exposed portions of the patterned resist layer 106a'', such that remaining portions 406 of the exposed portions of the patterned resist layer 106b'' remain at the upper portion of the sidewalls of the unexposed portions 116b, as shown in FIG. 4A in accordance with some embodiments.

Afterwards, a post treatment coating material 120b is formed to cover the patterned resist layer 106b'', as shown in FIG. 4B in accordance with some embodiments. The materials for forming the post treatment coating material 120b may be similar to, or the same as, the materials for forming the post treatment coating material 120 described previously and are not repeated herein.

After the post treatment coating material 120b is formed, a post treatment process is performed first and a second developing process is performed afterwards to remove the post treatment coating material 120b, as shown in FIG. 4C in accordance with some embodiments. In addition, both the remaining portions 406 of the exposed portions and the periphery portion of the unexposed portions 116b are dissolved in the second developer in the second developing process in accordance with some embodiments. The resulting unexposed portion 116b of the patterned resist layer 106b''' shown in FIG. 4C may be similar to, or the same as, the unexposed portion 116a shown in FIG. 3C and therefore details of its structure are not repeated herein.

In some other embodiments, the remaining portions 406 of the exposed portions may form bridges between the unexposed portions, and these bridges may also be removed by applying the post treatment coating material 120b and the post treatment process. Accordingly, the resolution of the lithography process may be improved.

Figure 5A:
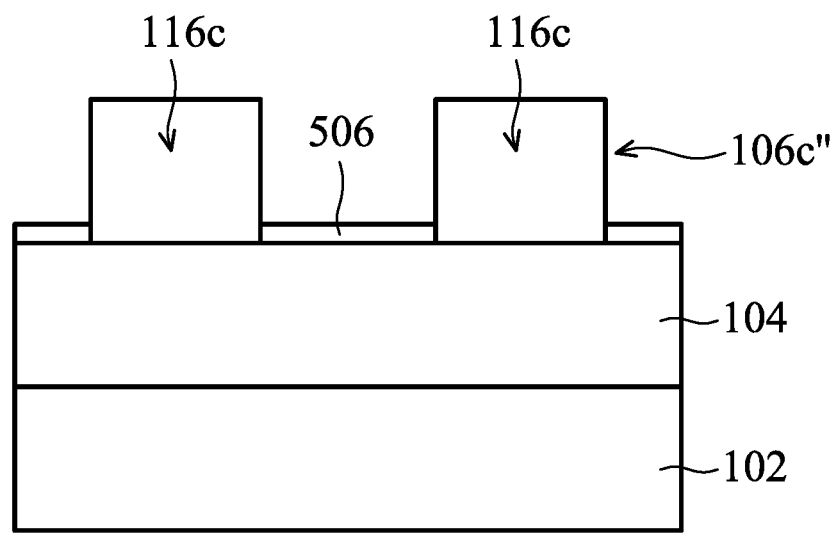
FIGS. 5A to 5C show cross-sectional representations of various stages of performing a lithography process in accordance with some embodiments.
Figure 5B:
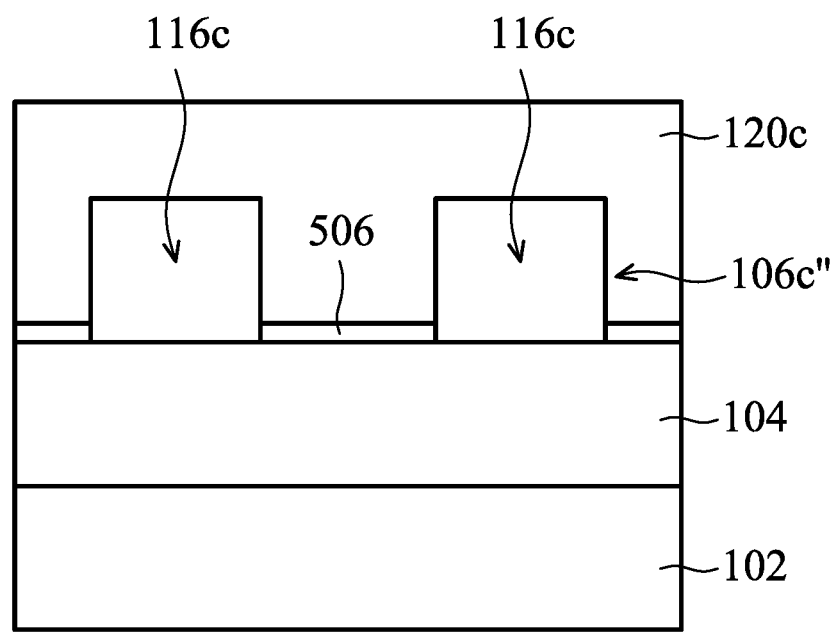
Figure 5C:
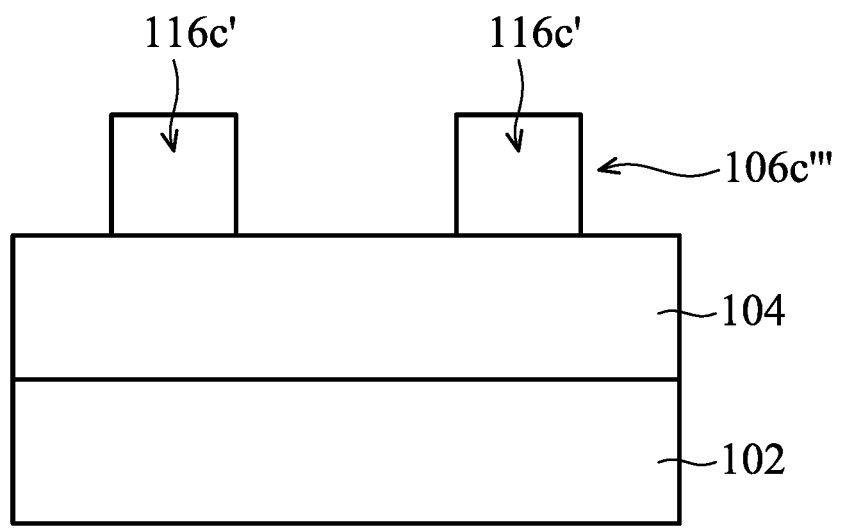

FIGS. 5A to 5C show cross-sectional representations of various stages of performing a lithography process in accordance with some embodiments. The lithography process shown in FIGS. 5A to 5C may be similar to the lithography process shown in FIGS. 1A to 1F, except a polymer layer is formed over the material layer after the first developing process is performed. Some materials and processes of the lithography process shown in FIGS. 5A to 5C may be similar to, or the same as, those shown in FIGS. 1A to 1H and are not repeated herein.

In particular, an exposure process similar to those shown in FIGS. 1A and 1B is performed, and a first developing process is performed to remove the exposed portions of the patterned resist layer 106c'', as shown in FIG. 5A in accordance with some embodiments. In addition, a polymer layer 506 is formed over the top surface of the material layer 104 during the first developing process in accordance with some embodiments. The formation of the polymer layer 506 may result from the interfacial adhesion between the material layer 104 and particles/compounds over the material layer 104 during the first developing process. In some embodiments, the polymer layer 506 includes the residues of the exposed portion of the patterned resist layer 106c'' and the first developer used in the first developing process.

Afterwards, a post treatment coating material 120c is formed to cover the patterned resist layer 106c'', as shown in FIG. 5B in accordance with some embodiments. In some embodiments, the post treatment coating material 120c is directly formed on the top surface and the sidewalls of the unexposed portions 116c and on the polymer layer 506. The materials for forming the post treatment coating material 120c may be similar to, or the same as, the materials for forming the post treatment coating material 120 described previously and are not repeated herein.

After the post treatment coating material 120c is formed, a post treatment process is performed first and a second developing process is performed afterwards to remove the post treatment coating material 120c and the polymer layer 506, as shown in FIG. 5C in accordance with some embodiments. In some embodiments, the polymer layer 506 and the top portion of the unexposed portions 116c are both dissolved in the second developer in the second developing process. The resulting unexposed portion 116c of the patterned resist layer 106c''' shown in FIG. 5C may be similar to, or the same as, the unexposed portion 116 shown in FIG. 1F and therefore details of its structure are not repeated herein.

Figure 6A:
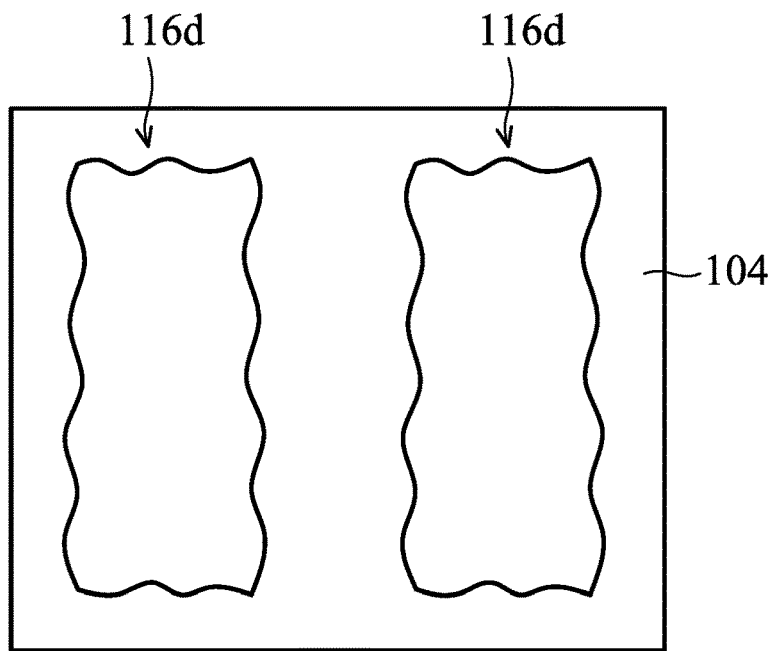
FIGS. 6A and 6B illustrate the top views of unexposed portions of a patterned resist layer before and after the post treatment process is performed in accordance with some embodiments.
Figure 6B:
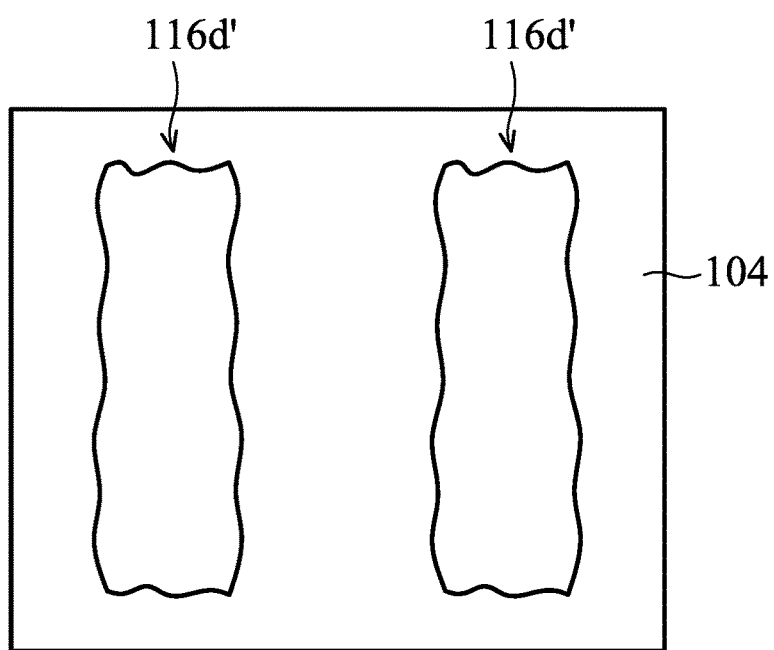

As described previously, the size of the unexposed portions of the patterned resist layers (e.g. the unexposed portions 116, 116a, 116b, and 116c) before the post treatment process is performed is greater than the size of the unexposed portions of the patterned resist layers (e.g. the unexposed portions 116', 116a', 116b', and 116c') after the post treatment process is performed. In addition, the line/space profile of the patterned resist layer may be trimmed to have improved line width roughness/line edge roughness. FIGS. 6A and 6B illustrate the top views of unexposed portions of a patterned resist layer before and after the post treatment process is performed in accordance with some embodiments.

More specifically, FIG. 6A illustrates the top view of the unexposed portions 116d of the patterned resist layers before the post treatment process is performed, and FIG. 6B illustrates the top view of the unexposed portions 116d' of the patterned resist layers after the post treatment process is performed in accordance with some embodiments. When unexposed portion 116d reacts with acids during the post treatment process (e.g. the post treatment process 122), the polymer of the unexposed portion 116d may be redistributed and therefore the profile of the unexposed portion 116d may be smoothened. Accordingly, the resulting unexposed portions 116d' may have an improved line width roughness/line edge roughness.

The unexposed portions 116d shown in FIG. 6A may be similar to the unexposed portions 116, 116a, 116b, and 116c and the unexposed portions 116d' shown in FIG. 6B may be similar to the unexposed portions 116', 116a', 116b', and 116c' described previously, and therefore details of these structures are not repeated herein.

Generally, lithography processes, including an exposure process and a developing process, are commonly used in semiconductor manufacturing processes. However, when the lithography processes is performed on a relatively large area, the uniformity of the resulting pattern may become difficult to control. For example, there may be "on-focus" regions and "de-focus" regions when a resist layer is exposed in the exposure process, and the resolution at the "de-focus" regions may be worse than the "on-focus" regions. Accordingly, in some embodiments of the disclosure, the post treatment coating material (e.g. post treatment coating material 120, 120a, 120b, 120c, and 120d) and the post treatment process are applied in the lithography processes, so that residues at the exposed portions (e.g. the remaining portions 306/406 and/or the polymer layer 506) of the resist layer may be removed. Therefore, the resolution of the resulting pattern may be improved, and the uniformity of the lithography process may also be improved.

Furthermore, the energy required for the lithography process may be reduced by performing the post treatment process described above. More specifically, the peripheral portion (e.g. the peripheral portion 124) of the unexposed portions may react with the post treatment coating material and may be removed by performing the second developing process. Therefore, the size of the unexposed portions (e.g. the unexposed portions 116', 116a', 116b', 116c', and 116d') of the resist layer after the second developing process is performed is smaller than the size of the unexposed portions (e.g. the unexposed portions 116, 116a, 116b, 116c, and 116d) of the resist layer before the second developing process is performed. Since the peripheral portion of the unexposed portions may not need to be exposed in the exposure process, the energy required for the lithography process may be reduced and the cost for performing the lithography process may also be reduced.

Embodiments of methods for performing a lithography process are provided. The method may include performing an exposure process and a developing process on a resist layer to form an opening between the unexposed portions of the resist layer. Next, a post treatment coating material may be formed to cover the unexposed portions of the resist layer and a post treatment process may be performed on the post treatment coating material, so that a peripheral portion of the unexposed portions of the resist layer may be removed. Therefore, the energy required for the lithography process may be reduced and the uniformity of the lithography process may be improved.

In some embodiments, a method for performing a lithography process is provided. The method for performing a lithography process includes forming a resist layer over a substrate and exposing a portion of the resist layer to form an exposed portion between unexposed portions. The method for performing a lithography process further includes developing the resist layer to remove the exposed portion of the resist layer such that an opening is formed between the unexposed portions and forming a post treatment coating material in the opening and over the unexposed portions of the resist layer. The method for performing a lithography process further includes reacting a portion of the unexposed portions of the resist layer with the post treatment coating material by performing a post treatment process and removing the post treatment coating material.

In some embodiments, a method for performing a lithography process is provided. The method for performing a lithography process includes forming a resist layer over a material layer and exposing an exposed portion of the resist layer by performing an exposure process. The method for performing a lithography process further includes dissolving a first portion of the exposed portion of the resist layer in a first developer to form an opening in the resist layer, while a second portion of the exposed portion remains on the material layer. The method for performing a lithography process further includes forming a post treatment coating material in the opening and over the second portion of the exposed portion of the resist layer and reacting the post treatment coating material with the second portion of the exposed portion of the resist layer. The method for performing a lithography process further includes removing the post treatment coating material and the second portion of the exposed portion of the resist layer.

In some embodiments, a method for performing a lithography process is provided. The method for performing a lithography process includes forming a resist layer over a substrate and exposing a portion of the resist layer to a radiation to form an exposed portion between unexposed portions of the resist layer. The method for performing a lithography process further includes dissolving the exposed portion of the resist layer in a first developer to form an opening between the unexposed portions of the resist layer and forming a post treatment coating material in the opening and over the unexposed portions of the resist layer. The method for performing a lithography process further includes performing a post treatment process on the post treatment coating material to release acids in the post treatment coating material and removing the post treatment coating material and a peripheral portion of the unexposed portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for performing a lithography process, comprising:
    forming a resist layer over a substrate;
    exposing a portion of the resist layer to form an exposed portion between unexposed portions;
    developing the resist layer to partially remove the exposed portion of the resist layer such that an opening is formed between the unexposed portions, wherein a first portion of a sidewall of the unexposed portion of the resist layer is covered by the exposed portion and a second portion of the sidewall of the unexposed portion of the resist layer is exposed through the opening;
    forming a post treatment coating material in the opening and over the unexposed portions of the resist layer;
    reacting a portion of the unexposed portions of the resist layer with the post treatment coating material by performing a post treatment process; and
    removing the post treatment coating material.

2. The method for performing a lithography process as claimed in claim 1, wherein the portion of the unexposed portions of the resist layer reacting with the post treatment coating material is removed with the post treatment coating material.

3. The method for performing a lithography process as claimed in claim 2, wherein the portion of the unexposed portions of the resist layer removed during the second developing process has a thickness in a range from about 1 nm to about 50 nm.

4. The method for performing a lithography process as claimed in claim 1, wherein the post treatment coating material comprises a photo-acid generator, a thermal acid generator, or a combination thereof.

5. The method for performing a lithography process as claimed in claim 4, wherein the photo-acid generator has a molecular weight in a range from about 300 to about 1000, and the thermal acid generator has a molecular weight in a range from about 60 to about 600.

6. The method for performing a lithography process as claimed in claim 1, wherein the post treatment coating material comprises a polymer that comprises a first functional group, and the first functional group is a moiety of methacrylic acid (MAA), methyl methacrylate (MMA), vinyl alcohol, hydroxystyrene (HS), 4-styrenesulfonic acid, fluoro-alcohol substituted alkane, or a fluorine substituted alkane.

7. The method for performing a lithography process as claimed in claim 6, wherein the polymer further comprises a second functional group, and the second functional group is a moiety of a photo-acid generator or a thermal acid generator.

8. The method for performing a lithography process as claimed in claim 1, wherein the post treatment process is a radiation curing process or a thermal baking process.

9. The method for performing a lithography process as claimed in claim 8, wherein acids are released during the post treatment process, and a pKa value of the acids is less than 3.

10. A method for performing a lithography process, comprising:
    forming a resist layer over a material layer;
    exposing an exposed portion of the resist layer by performing an exposure process;
    dissolving a first portion of the exposed portion of the resist layer in a first developer to form an opening in the resist layer, while a second portion of the exposed portion remains over the material layer;
    forming a post treatment coating material in the opening and over the second portion of the exposed portion of the resist layer;
    reacting the post treatment coating material with the second portion of the exposed portion of the resist layer; and
    removing the post treatment coating material and the second portion of the exposed portion of the resist layer.

11. The method for performing a lithography process as claimed in claim 10, wherein the post treatment coating material and the second portion of the exposed portion of the resist layer are removed by dissolving the post treatment coating material and the second portion of the exposed portion of the resist layer in a second developer.

12. The method for performing a lithography process as claimed in claim 10, wherein the post treatment coating material is heated to produce acids that react with the second portion of the exposed portion of the resist layer.

13. The method for performing a lithography process as claimed in claim 10, wherein a radiation curing process is performed on the post treatment coating material to produce acids that reacts with the second portion of the exposed portion of the resist layer.

14. The method for performing a lithography process as claimed in claim 10, wherein the second portion of the exposed portion of the resist layer is located at an upper portion of a sidewall of an unexposed portion of the resist layer.

15. The method for performing a lithography process as claimed in claim 10, wherein the post treatment coating material comprises a photo-acid generator or a thermal acid generator.

16. The method for performing a lithography process as claimed in claim 10, wherein a width of the opening in the resist layer is enlarged by removing the second portion of the exposed portion of the resist layer.

17. A method for performing a lithography process, comprising:

forming a resist layer over a substrate;

exposing a portion of the resist layer to a radiation to form an exposed portion between unexposed portions of the resist layer;

dissolving the exposed portion of the resist layer in a first developer to form an opening between the unexposed portions of the resist layer and to form a polymer layer between the unexposed portions of the resist layer;

forming a post treatment coating material in the opening, over the polymer layer, and over the unexposed portions of the resist layer;

performing a post treatment process on the post treatment coating material to release acids in the post treatment coating material; and removing the post treatment coating material and a peripheral portion of the unexposed portions.

18. The method for performing a lithography process as claimed in claim 17, wherein the acids in the post treatment process react with the peripheral portion of the unexposed portions.

19. The method for performing a lithography process as claimed in claim 17, wherein the post treatment coating material and the peripheral portion of the unexposed portions are removed by dissolving the post treatment coating material and the peripheral portion of the unexposed portions in a developer.

20. The method for performing a lithography process as claimed in claim 17, further comprising:

removing the polymer layer with the post treatment coating material and the peripheral portion of the unexposed portions.

* * * * *